(12) United States Patent
Tashima et al.

(10) Patent No.: US 11,084,521 B2
(45) Date of Patent: Aug. 10, 2021

(54) ELECTRONIC CONTROL UNIT AND ELECTRIC POWER STEERING DEVICE USING THE SAME

(71) Applicant: DENSO CORPORATION, Kariya (JP)

(72) Inventors: Tsuyoshi Tashima, Kariya (JP); Takayuki Uchida, Kariya (JP)

(73) Assignee: DENSO CORPORATION, Kariya (JP)

( * ) Notice: Subject to any disclaimer, the term of this patent is extended or adjusted under 35 U.S.C. 154(b) by 503 days.

(21) Appl. No.: 16/067,972

(22) PCT Filed: Dec. 16, 2016

(86) PCT No.: PCT/JP2016/087497
§ 371 (c)(1),
(2) Date: Jul. 3, 2018

(87) PCT Pub. No.: WO2017/119263
PCT Pub. Date: Jul. 13, 2017

(65) Prior Publication Data
US 2019/0023308 A1   Jan. 24, 2019

(30) Foreign Application Priority Data
Jan. 8, 2016   (JP) .............................. JP2016-002868

(51) Int. Cl.
*B62D 5/04*   (2006.01)
*H05K 7/20*   (2006.01)
(Continued)

(52) U.S. Cl.
CPC ......... *B62D 5/0406* (2013.01); *B62D 5/0463* (2013.01); *H01L 23/3121* (2013.01);
(Continued)

(58) Field of Classification Search
CPC .... B62D 5/0406; H05K 1/0209; H05K 7/209; H01L 23/36; H01L 23/3121
See application file for complete search history.

(56) References Cited

U.S. PATENT DOCUMENTS 10,321,554 B2 * 6/2019 Asao .................. H01L 25/072
2010/0254093 A1   10/2010 Oota et al.
(Continued)

FOREIGN PATENT DOCUMENTS

JP   2002-093960 A   3/2002
JP   2004-022983 A   1/2004
(Continued)

OTHER PUBLICATIONS

U.S. Appl. No. 16/067,971 and its entire file history, filed Jul. 3, 2018, Shinji Shibata, et al.

*Primary Examiner* — Minnah L Seoh
*Assistant Examiner* — Harold Eric Pahlck, III
(74) *Attorney, Agent, or Firm* — Maschoff Brennan

(57) ABSTRACT

An electronic control unit includes: a substrate (10); a heat generating component (20) provided on one surface (11) of the substrate and generates heat during operation; a heat conducting component (40) formed of a material having a heat conductivity equal to or higher than a predetermined value and provided on the one surface of the substrate such that at least a part of the heat conducting component is located in a range (R1) of a predetermined distance (L) from the heat generating component; a controller (60) provided on the substrate and controlling the operation of the heat generating component to control the object to be controlled; and a radiator (70) provided adjacent to the one surface of the substrate to radiate heat from the heat generating component and the heat conducting component. A distance (d1, d3) between the heat generating component and the radiator (Continued)

is equal to or shorter than a distance (d2, d4) between the heat conducting component and the radiator.

16 Claims, 5 Drawing Sheets

(51) Int. Cl.
*H05K 1/02* (2006.01)
*H01L 23/36* (2006.01)
*H01L 23/31* (2006.01)
*H01L 23/40* (2006.01)
*H01L 25/11* (2006.01)

(52) U.S. Cl.
CPC ........... *H01L 23/36* (2013.01); *H05K 1/0203* (2013.01); *H05K 1/0209* (2013.01); *H05K 7/209* (2013.01); *H01L 23/4006* (2013.01); *H01L 25/115* (2013.01); *H01L 2023/405* (2013.01); *H01L 2023/4031* (2013.01); *H01L 2023/4062* (2013.01); *H01L 2023/4087* (2013.01); *H05K 2201/066* (2013.01); *H05K 2201/10166* (2013.01); *H05K 2201/10409* (2013.01)

(56) References Cited

U.S. PATENT DOCUMENTS

| | | |
|---|---|---|
| 2011/0013365 A1 | 1/2011 | Oota |
| 2012/0326292 A1 | 12/2012 | Ohashi et al. |
| 2013/0003306 A1 | 1/2013 | Oota et al. |

FOREIGN PATENT DOCUMENTS

| | | |
|---|---|---|
| JP | 5110049 B2 | 12/2012 |
| JP | 2013-004953 A | 1/2013 |
| JP | 2013-021348 A | 1/2013 |
| JP | 2014-011864 A | 1/2014 |
| JP | 5803856 B2 | 11/2015 |

\* cited by examiner

ELECTRONIC CONTROL UNIT AND ELECTRIC POWER STEERING DEVICE USING THE SAME

CROSS REFERENCE TO RELATED APPLICATION

This application is based on Japanese Patent Application No. 2016-2868 filed on Jan. 8, 2016, the disclosure of which is incorporated herein by reference.

TECHNICAL FIELD

The present disclosure relates to an electronic control unit and an electric power steering device using the same.

BACKGROUND ART

An electronic control unit has been conventionally known in which a heat conducting component is provided in a vicinity of a heat generating component, which generates heat during operation, so as to conduct heat generated from the heat generating component to a radiator thereby to release heat from the radiator. For example, Patent Literature 1 discloses an electronic control unit in which a heat generating component and a heat conducting component are provided on one surface of a substrate, and a radiator is provided adjacent to the one surface of the substrate.

PRIOR ART LITERATURE

Patent Literature

Patent Literature 1: JP 5803856 B2

SUMMARY OF INVENTION

In the electronic control unit of Patent Literature 1, the heat conducting component is provided adjacent to an inner area of an outer end portion of the radiator. Also, a distance between the heat conducting component and the radiator is shorter than a distance between the heat generating component and the radiator. Therefore, if the radiator and the substrate come close to each other due to vibrations, external force, or the like, there is a fear that the radiator comes into contact with the heat conducting component, resulting in positional deviation of the heat conducting component from the substrate or falling of the heat conducting component off the substrate. In such a case, it is a fear that the effect of releasing heat from the heat generating component is deteriorated.

In a case where the heat conducting component is formed of an electric conductor, and is electrically connected to the heat generating component, if the radiator comes into contact with the heat conducting component, the radiator and the heat conducting component will be short-circuited.

An object of the present disclosure is to provide an electronic control unit capable of stabilizing the position of a heat conducting component with respect to a heat generating component, and effectively releasing heat from the heat generating component, and an electric power steering device using the same.

According to an aspect of the present disclosure, an electronic control unit is an electronic control unit that is configured to control an object to be controlled, and includes a substrate, a heat generating component, a heat conducting component, a controller, and a radiator.

The heat generating component is provided on one surface of the substrate, and generates heat during operation.

The heat conducting component is formed of a material having a heat conductivity equal to or higher than a predetermined value, and is provided on the one surface of the substrate such that at least a part of the heat conducting component is located in a range of a predetermined distance from the heat generating component. Therefore, heat from the heat generating component is conducted to the heat conducting component. Accordingly, it is possible to restrict an excessive increase in temperature of the heat generating component.

The controller is provided on the substrate, and controls the operation of the heat generating component to control the object to be controlled.

The radiator is provided adjacent to the one surface of the substrate so as to release the heat from the heat generating component and the heat conducting component. Therefore, it is possible to further effectively restrict an excessive increase in temperature of the heat generating component.

In addition, a distance between the heat generating component and the radiator is equal to or shorter than a distance between the heat conducting component and the radiator. Therefore, even if the radiator and the substrate come closer to each other due to vibrations, external force, or the like, the heat generating component and the radiator come into contact with each other, whereby it is possible to reliably restrict an application of a large force from the radiator to the heat conducting component. This can reliably restrict positional deviation of the heat conducting component from the substrate and falling of the heat conducting component off the substrate. Therefore, it is possible to stabilize the position of the heat conducting component with respect to the heat generating component, and to effectively release the heat from the heat generating component.

For example, when the distance between the heat generating component and the radiator is smaller than the distance between the heat conducting component and the radiator, the position of the heat conducting component with respect to the heat generating component is further stabilized, and the effects described above can be further enhanced.

For example, in a case where the heat conducting component is formed of an electric conductor and is electrically connected to the heat generating component or the like, it is possible to restrict the short-circuit between the radiator and the heat conducting component due to the radiator coming into contact with the heat conducting component.

The electronic control unit is used, for example, in an electric power steering device. In this case, the electronic control unit controls a device that outputs assist torque for assisting steering by the driver as an object to be controlled.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
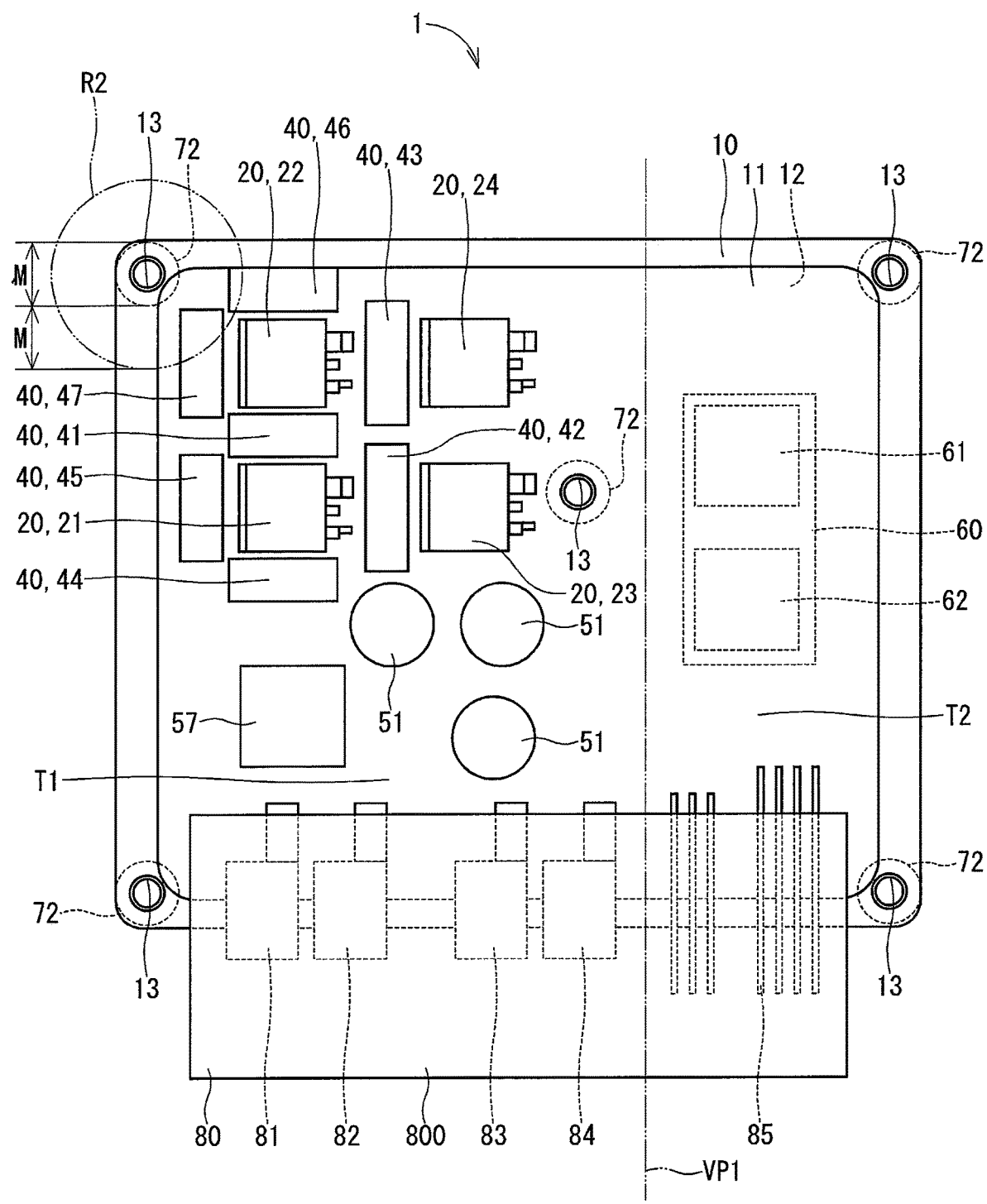
FIG. 1 is a plan view showing an electronic control unit according to a first embodiment of the present disclosure.

Hereinafter, an electronic control unit according to each of a plurality of embodiments of the present disclosure will be described with reference to the drawings. In the plurality of embodiments, substantially the same constituent parts are designated with the same reference numerals, and the descriptions thereof are omitted. Further, in order to avoid complicated description of the drawings, in one drawing, a plurality of substantially the same members or parts may be indicated by a reference numeral only for one of the plurality of members or parts.

First Embodiment

Figure 2:
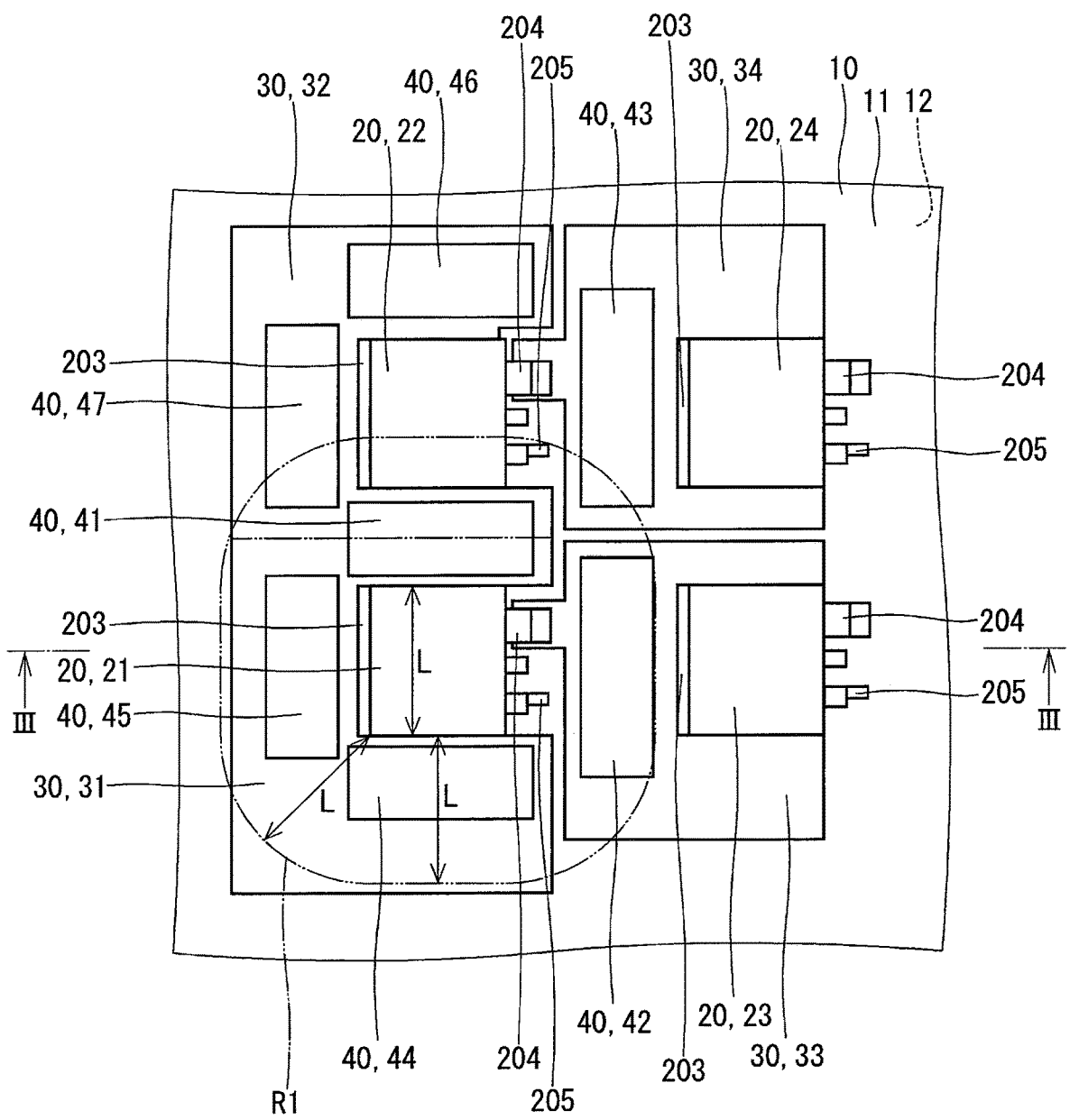
FIG. 2 is a schematic diagram showing a vicinity of heat generating components of the electronic control unit according to the first embodiment of the present disclosure.
Figure 3:
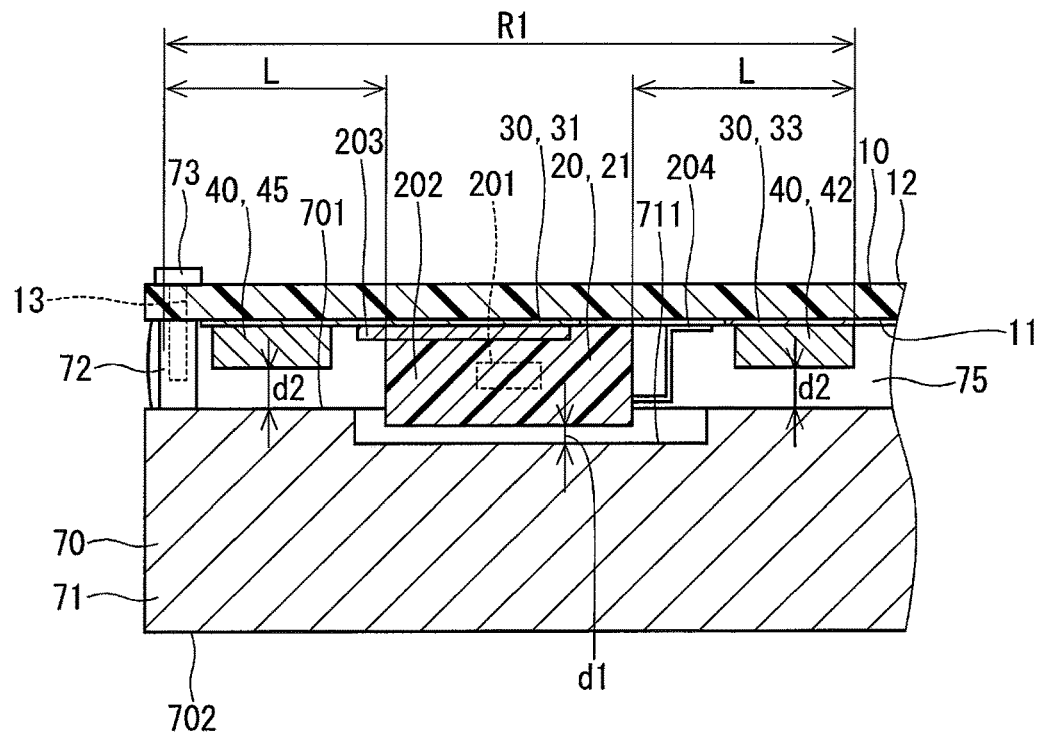
FIG. 3 is a sectional view taken along a line III-III of FIG. 2.
Figure 4:
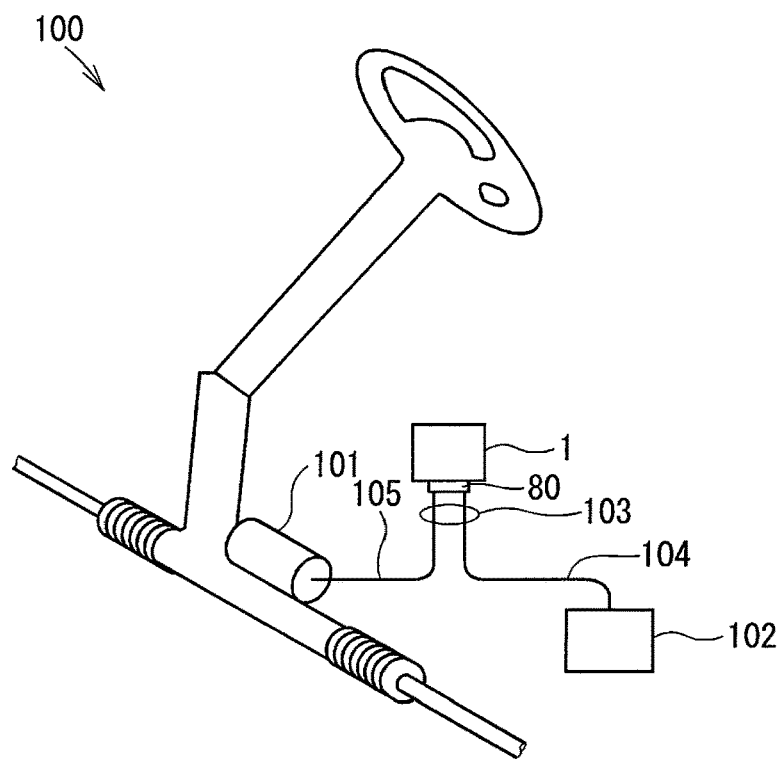
FIG. 4 is a schematic view showing a state in which the electronic control unit according to the first embodiment of the present disclosure is applied to an electric power steering device.

An electronic control unit according to a first embodiment of the present disclosure is shown in FIGS. 1 to 3. As shown in FIG. 4, an electronic control unit 1 is used in an electric power steering device 100 of a vehicle, and drives and controls a motor 101 that generates assist torque for assisting steering by a driver, based on a steering torque signal, a vehicle speed signal, and the like. Here, the motor 101 corresponds to the object to be controlled.

The electronic control unit 1 includes a substrate 10, a semiconductor module 20 as a heat generating component, a printed wire 30 as wiring, a heat conducting component 40, a capacitor 51 as an electronic component, relays 55, 56, a coil 57, a controller 60, a heat sink 70 as a radiator, a heat conducting member 75, a connector 80, and the like.

The substrate 10 is a printed wiring board such as FR-4 made of glass fiber and epoxy resin. The substrate 10 is formed into a substantially rectangular shape.

In the present embodiment, the semiconductor module 20 is a semiconductor component including a semiconductor device such as a MOS-FET or an IGBT. As shown in FIGS. 1 to 3, the semiconductor module 20 is formed into, for example, a rectangular plate shape, and is mounted on one surface 11 of the substrate 10 such that the planar direction is parallel to the surface of the substrate 10. In the present embodiment, four semiconductor modules 20 (21 to 24) are provided.

As shown in FIGS. 2 and 3, the semiconductor modules 20 each have a switching device 201, a sealing body 202, and terminals 203, 204, 205.

The switching device 201 is a semiconductor device such as a MOS-FET or an IGBT. The switching device 201 generates heat during switching operation. The switching device 201 corresponds to a heat generating element.

The sealing body 202 is formed of, for example, an insulator such as resin, and covers the switching device 201. The sealing body 202 is formed into, for example, a rectangular plate shape.

The terminal 203 is formed into a rectangular plate shape by an electric conductor such as copper. The terminal 203 is electrically connected to a drain of the switching device 201. The terminal 203 is provided in the sealing body 202 such that a surface thereof opposite from the switching device 201 is exposed from the sealing body 202.

The terminal 204 is formed of an electric conductor such as copper. The terminal 204 is electrically connected to a source of the switching device 201. The terminal 204 is provided in the sealing body 202 such that an end portion opposite from the switching device 201 is exposed from the sealing body 202.

The terminal 205 is formed of an electric conductor such as copper. The terminal 205 is electrically connected to a gate of the switching device 201. The terminal 205 is provided in the sealing body 202 such that the opposite end portion from the switching device 201 is exposed from the sealing body 202.

As shown in FIGS. 2 and 3, the printed wire 30 is provided on one surface 11 of the substrate 10.

The printed wire 30 is formed on the surface of the substrate 10 by printing a pattern made of an electric conductor such as copper. Note that the heat conductivity of the printed wire 30 is equal to or higher than a predetermined value, for example about (300 K) 401 W/(m·K). In the present embodiment, four printed wires 30 (31 to 34) are provided.

The printed wires 31, 32, 33, 34 are each formed in a substantially rectangular thin film shape, and are arranged adjacent to each other (see FIG. 2). The printed wire 31 and the printed wire 32 are formed integrally.

The semiconductor modules 21, 22, 23, 24 are provided so as to correspond to the printed wires 31, 32, 33, 34, respectively.

The semiconductor module 21 is provided such that a surface of the terminal 203 opposite from the switching device 201 faces or is in contact with the printed wire 31. The terminal 203 of the semiconductor module 21 is soldered to the printed wire 31. The terminal 204 of the semiconductor module 21 is soldered to the printed wire 33.

The semiconductor module 22 is provided such that the surface of the terminal 203 opposite from the switching device 201 faces or is in contact with the printed wire 32. The terminal 203 of the semiconductor module 22 is soldered to the printed wire 32. The terminal 204 of the semiconductor module 22 is soldered to the printed wire 34.

The semiconductor module 23 is provided such that the surface of the terminal 203 opposite from the switching device 201 faces or is in contact with the printed wire 33. The terminal 203 of the semiconductor module 23 is soldered to the printed wire 33.

The semiconductor module 24 is provided such that the surface of the terminal 203 opposite from the switching device 201 faces or is in contact with the printed wire 34. The terminal 203 of the semiconductor module 24 is soldered to the printed wire 34.

As shown in FIGS. 1 to 3, the heat conducting component 40 is provided on the one surface 11 of the substrate 10. The heat conducting component 40 is formed into a rectangular plate shape, and is formed of an electric conductor such as copper. The heat conducting component 40 has a heat conductivity equal to or higher than a predetermined value, for example about (300 K) 401 W/(m·K). Note that the heat conducting component 40 has a specific heat capacity of, for example, about $385 \times 10^2$ J/(kg·K). In the present embodiment, the heat conducting component 40 is plated with tin nickel. This has improved the corrosion resistance and solderability of the heat conducting component 40. In the present embodiment, seven heat conducting components 40 (41 to 47) are provided.

The heat conducting component 41 is provided between the semiconductor module 21 and the semiconductor module 22. The heat conducting component 41 is provided such that one surface thereof faces or is in contact between the printed wire 31 and the printed wire 32. The heat conducting component 41 is soldered between the printed wire 31 and the printed wire 32. The heat conducting component 41 is provided such that the longitudinal direction thereof is substantially parallel to a side of the sealing body 202 of the semiconductor modules 21, 22.

The heat conducting component 42 is provided between the semiconductor module 21 and the semiconductor module 23. The heat conducting component 42 is provided such that one surface thereof faces or is in contact with the printed wire 33. The heat conducting component 42 is soldered to the printed wire 33. The heat conducting component 42 is provided such that the longitudinal direction thereof is substantially parallel to a side of the sealing body 202 of each of the semiconductor modules 21, 23.

The heat conducting component 43 is provided between the semiconductor module 22 and the semiconductor module 24. The heat conducting component 43 is provided such that one surface thereof faces or is in contact with the printed wire 34. The heat conducting component 43 is soldered to the printed wire 34. The heat conducting component 43 is provided such that the longitudinal direction thereof is substantially parallel to a side of the sealing body 202 of the semiconductor modules 22, 24.

The heat conducting component 44 is provided on the opposite side of the semiconductor module 21 from the heat conducting component 41. The heat conducting component 44 is provided such that one surface thereof faces or is in contact with the printed wire 31. The heat conducting component 44 is soldered to the printed wire 31. The heat conducting component 44 is provided such that the longitudinal direction thereof is substantially parallel to a side of the semiconductor module 21.

The heat conducting component 45 is provided on the opposite side of the semiconductor module 21 from the heat conducting component 42. The heat conducting component 45 is provided such that one surface thereof faces or is in contact with the printed wire 31. The heat conducting component 45 is soldered to the printed wire 31. The heat conducting component 45 is provided such that the longitudinal direction thereof is substantially parallel to a side of the semiconductor module 21.

The heat conducting component 46 is provided on the opposite side of the semiconductor module 22 from the heat conducting component 41. The heat conducting component 46 is provided such that one surface thereof faces or is in contact with the printed wire 32. The heat conducting component 46 is soldered to the printed wire 32. The heat conducting component 46 is provided such that the longitudinal direction thereof is substantially parallel to a side of the semiconductor module 22.

The heat conducting component 47 is provided on the opposite side of the semiconductor module 22 from the heat conducting component 43. The heat conducting component 47 is provided such that one surface thereof faces or is in contact with the printed wire 32. The heat conducting component 47 is soldered to the printed wire 32. The heat conducting component 47 is provided such that the longitudinal direction thereof is substantially parallel to a side of the semiconductor module 22.

In this manner, the heat conducting components 41, 42, 43 are respectively provided between the semiconductor module 21 and the semiconductor module 22, between the semiconductor module 21 and the semiconductor module 23, and between the semiconductor module 22 and the semiconductor module 24. That is, the heat conducting components 40 are provided such that at least a part of the heat conducting components 40 is located between the plurality of semiconductor modules 20.

The heat conducting components 41, 44, 45 are provided so as to surround the semiconductor module 21. The heat conducting components 41, 46, 47 are provided so as to surround the semiconductor module 22. That is, the heat conducting components 40 are provided such that at least a part of the heat conducting components 40 surrounds the semiconductor modules 20.

As shown in FIG. 2, the length of a longitudinal side of the sealing body 202 of the semiconductor modules 20 is defined as length L. In this case, the heat conducting components 41, 44, 45 are provided so as to be located within a range R1 of the predetermined distance L from the outer edge of the sealing body 202 of the semiconductor module 21. Likewise, the heat conducting components 41, 46, 47 are provided so as to be located within the range R1 of the predetermined distance L from the outer edge of the sealing body 202 of the semiconductor module 22. Likewise, the heat conducting component 42 is provided so as to be located within the range R1 of the predetermined distance L from the outer edge of the sealing body 202 of the semiconductor module 23. Likewise, the heat conducting component 43 is provided so as to be located within the range R1 of the predetermined distance L from the outer edge of the sealing body 202 of the semiconductor module 24.

Further, in the present embodiment, the lengths of the heat conducting components 41 to 47 in the longitudinal direction thereof are longer than the length L of the longitudinal side of the sealing body 202 of the semiconductor modules 20.

As described above, in the present embodiment, the heat conducting components 40 are provided in the vicinity of the plurality of semiconductor modules 20 such as between the semiconductor modules 20 or around the semiconductor modules 20. Therefore, heat from each of the semiconductor modules 20 is conducted to the heat conducting components 40.

In the present embodiment, the capacitor 51 is, for example, an aluminum electrolytic capacitor. The capacitor 51 is formed in a substantially columnar shape, for example, and is mounted on the one surface 11 of the substrate 10 such that its axial direction is perpendicular to the surface of the substrate 10 (see FIG. 1). Three capacitors 51 are provided in the present embodiment.

In the present embodiment, the relays 55, 56 are, for example, mechanical relays configured in a mechanical manner. The relays 55, 56 are mounted on, for example, the other surface 12 of the substrate 10.

In the present embodiment, the coil 57 is, for example, a choke coil. The coil 57 is formed into, for example, a rectangular column shape, and is mounted on the one surface 11 of the substrate 10 (see FIG. 1) such that its height direction is perpendicular to the surface of the substrate 10.

Figure 5:
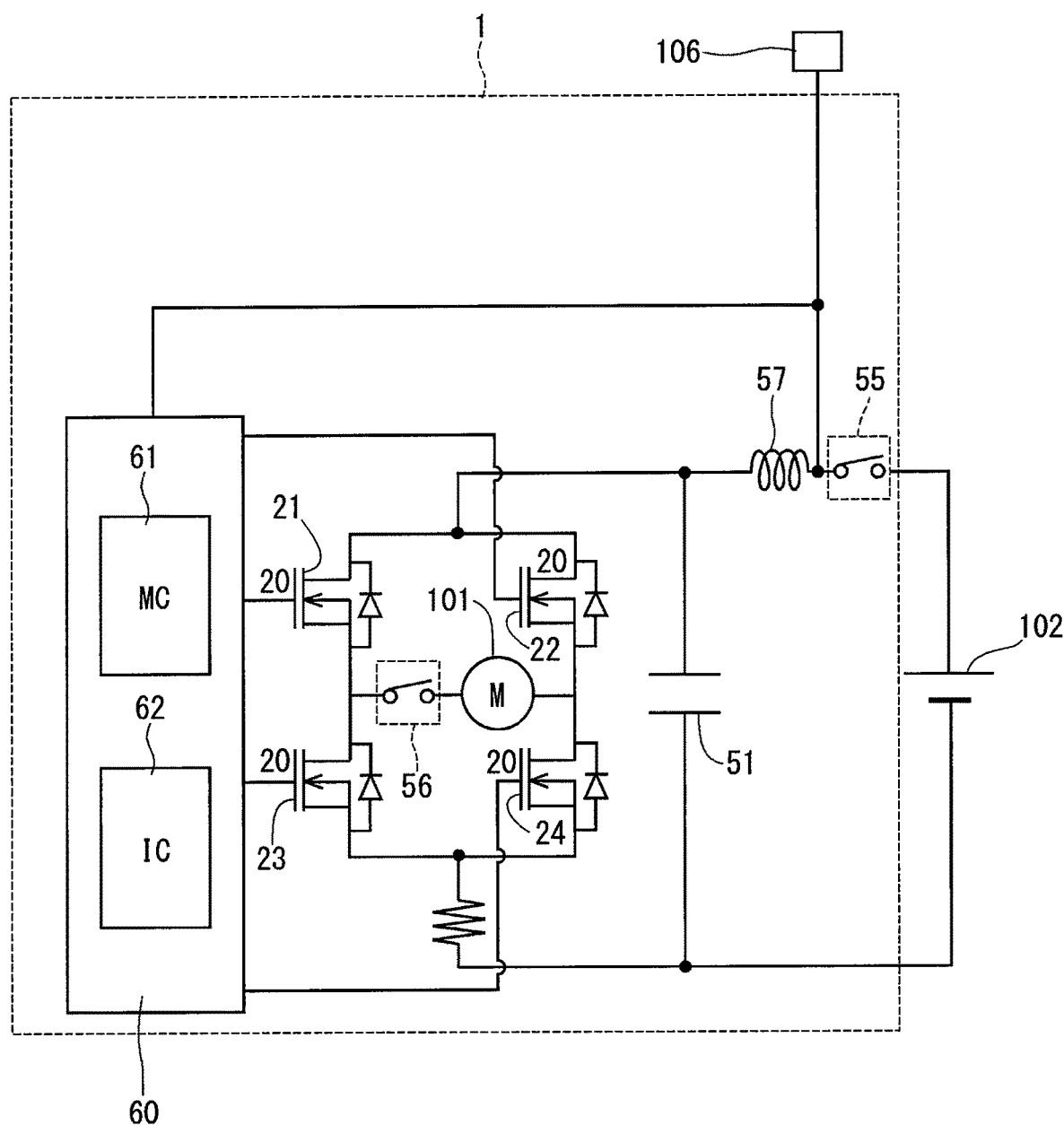
FIG. 5 is a diagram showing an electrical configuration of the electronic control unit according to the first embodiment of the present disclosure.

The controller 60 includes, for example, a microcomputer 61 (MC in FIG. 5) and a customized IC 62 (IC in FIG. 5). The microcomputer 61 and the customized IC 62 are semiconductor packages including, for example, a CPU, a ROM, a RAM, and an I/O. The controller 60 controls the operation of the relays 55, 56 and the semiconductor modules 20 (21 to 24). The controller 60 controls the rotational driving of the motor 101 (M in FIG. 5) by controlling the operation of the semiconductor modules 20, based on a signal from a sensor or the like provided in each part of the vehicle.

As shown in FIG. 1, the microcomputer 61 and the customized IC 62 are mounted on the other surface 12 of the substrate 10.

Here, the electrical connection between the semiconductor modules 20, the capacitor 51, the relays 55, 56, the coil 57, and the controller 60 will be described with reference to FIG. 5.

The positive terminal of a battery 102, which is a power supply of the vehicle, is connected to the relay 55. The relay 55 is controlled by the controller 60, and performs the on/off operation to allow or interrupt the supply of electric power from the battery 102 to the electronic control unit 1. That is, in the present embodiment, the relay 55 is a power supply relay.

The electric power from the battery 102 is supplied to the semiconductor modules 20 (21 to 24) via the coil 57. The coil 57 removes noise of electric power supplied from the battery 102 to the motor 101 via the electronic control unit 1.

An ignition power supply 106 of the vehicle is connected between the relay 55 and the coil 57, and is also connected to the controller 60. The controller 60 (microcomputer 61, customized IC 62) operates by electric power from the ignition power supply 106.

As shown in FIG. 5, the semiconductor module 21 and the semiconductor module 23 are connected in series, and the semiconductor module 22 and the semiconductor module 24 are connected in series. Further, the two semiconductor modules 21 and 23 and the two semiconductor modules 22 and 24 are connected together in parallel.

The relay 56 and the motor 101 are disposed between the connection points of the two semiconductor modules 21 and 23 and the connection points of the two semiconductor modules 22 and 24. Further, the capacitor 51 is connected in parallel between a power supply line and the ground. The capacitor 51 restricts a surge voltage generated by the on/off operation (switching operation) of the semiconductor modules 20 (21 to 24).

In the above configuration, for example, when the semiconductor modules 21 and 24 are turned on and the semiconductor modules 22 and 23 are turned off, the current flows through the order of the semiconductor module 21, the relay 56, the motor 101, and the semiconductor module 24. On the other hand, when the semiconductor modules 22 and 23 are turned on and the semiconductor modules 21 and 24 are turned off, the current flows through the order of the semiconductor module 22, the motor 101, the relay 56, and the semiconductor module 23. Since the motor 101 is a direct-current motor, the motor 101 is rotationally driven by the on/off control of the semiconductor modules 20 (21 to 24) as described. Signal lines from the controller 60 (customized IC 62) are connected to the terminals 205 of the respective semiconductor modules 20 (21 to 24). That is, the controller 60 controls the rotational driving of the motor 101 by controlling the switching operation of the semiconductor modules 20.

In this case, the relay 56 is controlled by the controller 60, and performs the on/off operation to allow or interrupt the supply of electric power from the battery 102 to the motor 101 by turning on or off. That is, in the present embodiment, the relay 56 is a motor relay.

During the switching operation of the semiconductor modules 20, a current having a relatively large value flows through the semiconductor modules 20, the capacitor 51, the relays 55, 56, and the coil 57. Therefore, the switching devices 201 of the semiconductor modules 20, the capacitor 51, the relays 55, 56, and the coil 57 generate heat and get to relatively high temperatures. Here, the semiconductor modules 20 are components whose calorific value during operation is equal to or higher than a predetermined value, and corresponds to the heat generating components.

The heat sink 70 is formed of metal such as aluminum. The heat sink 70 includes a body 71, a pillar portion 72, and a screw 73. The body 71 is formed in, for example, a rectangular plate shape. The heat sink 70 is provided such that one surface 701 of the body 71 faces the one surface 11 of the substrate 10 (see FIG. 3).

Note that the heat sink 70 has a specific heat capacity of, for example, about $900 \times 10^2$ J/(kg·K). In addition, the heat sink 70 has a heat conductivity of, for example, about (300 K) 237 W/(m·K).

A predetermined gap is formed between the one surface 701 of the body 71 of the heat sink 70 and the one surface 11 of the substrate 10.

The one surface 701 of the body 71 is formed with a specific depression (first depression) 711, which is a depression that is depressed toward the other surface 702, namely, in a direction opposite to the substrate 10. The specific depression 711 is formed at a position corresponding to the semiconductor module 20. The specific depression 711 is formed into a rectangular shape so as to correspond to the shape of the sealing body 202 of the semiconductor module 20. Note that the specific depression 711 is larger than the sealing body 202. Four specific depressions 711 are formed so as to correspond to the semiconductor modules 21 to 24, respectively.

As shown in FIG. 3, in the present embodiment, a distance d1 between the sealing body 202 of the semiconductor module 20 and the specific depression 711 of the heat sink 70 is equal to or shorter than a distance d2 between the heat conducting component 40 and the one surface 701 of the heat sink 70. In the present embodiment, the distance d1 is shorter than the distance d2. Therefore, even if the heat sink 70 and the substrate 10 come closer to each other due to vibrations, external force, or the like, the sealing body 202 of the semiconductor modules 20 and the heat sink 70 come into contact with each other, whereby it is possible to reliably restrict the contact between the heat sink 70 and the heat conducting components 40. This can reliably restrict positional deviation of the heat conducting components 40 from the substrate 10 and falling of the heat conducting components 40 off the substrate 10.

In a case where the heat conducting components 40 are formed of the electric conductor and are electrically connected to the semiconductor modules 20 by the printed wire 30 as in the present embodiment, when the heat sink 70 comes into contact with the heat conducting components 40, the heat sink 70 and the heat conducting components 40 may be short-circuited. However, in the present embodiment, the contact between the heat sink 70 and the heat conducting components 40 can be restricted by the configuration described above. Therefore, a short circuit between the heat sink 70 and the heat conducting components 40 can also be restricted.

The pillar portion 72 is formed so as to extend in a substantially cylindrical shape from the body 71 toward the substrate 10. In the present embodiment, the pillar portions 72 are provided at predetermined places including the four corners of the substrate 10 (see FIG. 1).

The substrate 10 has screw holes 13 at predetermined places including four corners. The screw 73 is passed through the screw hole 13, and is screwed into the pillar portion 72 of the heat sink 70. This stabilizes the position of the substrate 10 with respect to the heat sink 70.

As shown in FIG. 1, the diameter of the pillar portion 72 is defined as diameter M. In this case, the heat conducting components 46, 47 are provided such that a part of the heat conducting components 46, 47 is located within a range R2 of the predetermined distance M from the outer wall of the pillar portion 72.

In the present embodiment, the heat conducting member 75 is, for example, heat releasing grease. The heat releasing grease is, for example, a gel-like member using silicon as a base material and having a small heat resistance. The heat conducting member 75 is provided between the one surface 11 of the substrate 10 and the one surface 701 of the heat sink 70 so as to be in contact with the substrate 10, the semiconductor modules 20, the printed wire 30, the heat conducting components 40, and the heat sink 70.

Hence, the heat conducting member 75 can conduct heat from the semiconductor modules 20 and the heat conducting components 40 to the heat sink 70. Hence, it is possible to release heat from the semiconductor modules 20 and the heat conducting components 40 via the heat conducting member 75 and the heat sink 70.

In the present embodiment, the terminals 203, 204 of the semiconductor modules 20 are connected to the heat conducting components 40 by the printed wire 30, so that heat from the switching device 201 of the semiconductor modules 20 is rapidly conducted to the heat conducting components 40 via the terminals 203, 204 and the printed wire 30. Therefore, heat from the semiconductor modules 20 can be rapidly released via the printed wire 30, the heat conducting components 40, the heat conducting member 75, and the heat sink 70.

As shown in FIG. 1, the connector 80 has a connector body 800, power supply terminals 81 to 84, and a signal terminal 85. The connector body 800 is, for example, formed into a rectangular tubular shape and is formed of resin. The connector body 800 is provided on an outer edge portion of the substrate 10.

The power supply terminals 81 to 84 and the signal terminal 85 are formed of an electric conductor such as copper. The power supply terminals 81 to 84 and the signal terminal 85 are insert-molded in the connector body 800.

The power supply terminal 81 is soldered to a printed wire (not shown) on the substrate 10, and is electrically connected to the terminals 203 of the semiconductor modules 21, 22, namely, the printed wire 31, 32 via the relay 55 and the coil 57. The power supply terminal 82 is soldered to the printed wire on the substrate 10, and is electrically connected to the terminal 204 of the semiconductor modules 23, 24.

The power supply terminal 83 is soldered to the printed wire on the substrate 10, and is electrically connected to the terminal 204 of the semiconductor module 21 and the terminal 203 of the semiconductor module 23, namely, the printed wire 33. The power supply terminal 84 is soldered to the printed wire on the substrate 10, and is electrically connected to the terminal 204 of the semiconductor module 22 and the terminal 203 of the semiconductor module 24, namely, the printed wire 34.

The signal terminal 85 is soldered to the printed wire on the substrate 10, and is electrically connected to the controller 60 (microcomputer 61, customized IC 62). A steering torque signal and a vehicle speed signal, which are signals for controlling the motor 101, flow through the signal terminal 85 via the controller 60.

When the motor 101 operates (rotates), a current having a relatively large value to be supplied to the motor 101 flows through the power supply terminals 81 to 84.

In the present embodiment, the heat conducting component 44 is provided between the semiconductor module 21 and the power supply terminals 81, 82 of the connector 80.

As shown in FIG. 1, when the substrate 10 is divided into two regions T1, T2 at a virtual plane VP1 orthogonal to the substrate 10, the semiconductor modules 20 and the power supply terminals 81 to 84 are provided in one region T1, and the controller 60 (microcomputer 61, customized IC 62) and the signal terminal 85 are provided in the other region T2.

A harness 103 is connected to the connector 80 (see FIG. 4). A conductive wire 104 of the harness 103 electrically connects the positive side of the battery 102 and the power supply terminal 81 of the connector 80. Further, a conductive wire 105 of the harness 103 electrically connects a winding terminal of the motor 101 and the power supply terminals 83, 84 of the connector 80. That is, the power supply terminals 83, 84 are motor terminals.

Next, the operation of the electronic control unit 1 of the present embodiment will be described.

When the driver of the vehicle turns on an ignition switch, electric power is supplied from the ignition power supply 106 to the electronic control unit 1, to activate the electronic control unit 1. When the electronic control unit 1 is activated, the controller 60 causes the relays 55, 56 to perform the on operation. This allows the supply of electric power from the battery 102 to the motor 101.

While the ignition switch is on, the controller 60 controls the rotational driving of the motor 101 by controlling the switching operation of the semiconductor modules 20 (21 to 24), based on the steering torque signal, the vehicle speed signal, and the like. As a result, the assist torque is output from the motor 101, to assist the steering by the driver.

In the present embodiment, when the controller 60 controls the switching operation of the semiconductor modules 20 (21 to 24) to control the rotational driving of the motor 101, current having a relatively large value flows through the semiconductor modules 20, the capacitor 51, the relays 55, 56, and the coil 57. Therefore, the semiconductor modules 20, the capacitor 51, the relays 55, 56, and the coil 57 generate heat and get to relatively high temperatures. Note that heat from the semiconductor modules 20 is partly guided to the heat conducting components 40 via the printed wire 30 or the heat conducting member 75.

Heat from the semiconductor modules 20 (21 to 24) and the heat conducting components 40 is guided to the heat sink 70 via the heat conducting member 75.

As described above, in the present embodiment, during the operation of the electronic control unit 1, heat from the semiconductor modules 20 (21 to 24) and the heat conducting components 40 can be effectively guided to the heat sink 70. Hence, it is possible to effectively release heat from the semiconductor modules 20 (21 to 24), which are heat generating components, and the heat conducting components 40.

As described above, the electronic control unit 1 of the present embodiment is an electronic control unit that controls the motor 101, and includes the substrate 10, the semiconductor modules 20, the heat conducting components 40, the controller 60, and the heat sink 70.

The semiconductor modules 20 are provided on the one surface 11 of the substrate 10, and generate heat during operation.

The heat conducting components 40 are formed of a material having a heat conductivity equal to or higher than a predetermined value, and are provided on the one surface 11 of the substrate 10 such that at least a part of the heat conducting components 40 is located in the range R1 of the predetermined length L from the semiconductor module 20. In the present embodiment, the predetermined distance L is the same as the length of the longitudinal side of the sealing body 202 of the semiconductor module 202. Therefore, heat of the semiconductor module 202 is conducted to the heat conducting component 40. This configuration restricts an excessive increase in temperature of the semiconductor module 20.

The controller 60 is provided on the substrate 10, and can control the motor 101 by controlling the operation of the semiconductor modules 20.

The heat sink 70 is provided adjacent to the one surface 11 of the substrate 10, and is capable of releasing heat from the semiconductor modules 20 and the heat conducting components 40. It is thus possible to further effectively restrict an excessive increase in the temperature of the semiconductor modules 20.

In the present embodiment, the distance d1 between the semiconductor module 20 and the heat sink 70 is set to be equal to or shorter than the distance d2 between the heat conducting component 40 and the heat sink 70. Therefore, even if the heat sink 70 and the substrate 10 come closer to each other due to vibrations, external force, or the like, the semiconductor modules 20 and the heat sink 70 come into contact with each other, so that it is possible to restrict application of large force from the heat sink 70 to the heat conducting components 40. This can restrict positional deviation of the heat conducting components 40 from the substrate 10 and falling of the heat conducting components 40 off the substrate 10. This stabilizes the position of the heat conducting components 40 with respect to the semiconductor modules 20, thus enabling effective releasing of heat from the semiconductor modules 20.

The distance d1 between the semiconductor module 20 and the heat sink 70 is set to be shorter than the distance d2 between the heat conducting component 40 and the heat sink 70. Therefore, even if the heat sink 70 and the substrate 10 come closer to each other due to vibrations, external force, or the like, the sealing body 202 of the semiconductor modules 20 and the heat sink 70 come into contact with each other, whereby it is possible to reliably restrict the contact between the heat sink 70 and the heat conducting components 40. It is thus possible to reliably restrict positional deviation of the heat conducting components 40 from the substrate 10 and falling of the heat conducting components 40 off the substrate 10.

The electronic control unit 1 further includes a heat conducting member 75 provided between the one surface 11 of the substrate 10 and the heat sink 70 and capable of conducting heat from the semiconductor modules 20 and the heat conducting components 40 to the heat sink 70. In this case, it is possible to effectively release heat from the semiconductor modules 20 and the heat conducting components 40, and to more effectively restrict an increase in the temperature of each of the semiconductor modules 20 and the heat conducting components 40.

The heat sink 70 has the specific depression 711 that is a depression depressed in a direction opposite to the substrate 10, at a position corresponding to the semiconductor module 20. In this case, a distance between the outer edge of the semiconductor module 20 and the heat sink 70 can be reduced. Therefore, heat of the semiconductor module 20 can be further effectively conducted to the heat sink 70.

The semiconductor module 20 includes the switching element 201, which generates heat during operation, and the sealing body 202 that covers at least a part of the switching element 201.

The printed wire 30 is provided on the one surface 11 of the substrate 10, and is electrically connected to the switching element 201.

The heat conducting component 40 is formed of an electric conductor, and is in contact with the printed wire 30.

In a case where the heat conducting component 40 is formed of the electric conductor and is electrically connected to the semiconductor module 20 by the printed wire 30, when the heat sink 70 comes into contact with the heat conducting component 40, the heat sink 70 and the heat conducting component 40 may be short-circuited. As described above, in the case where the distance d1 between the semiconductor module 20 and the heat sink 70 is set to be smaller than the distance d2 between the heat conducting component 40 and the heat sink 70, it is possible to restrict the heat sink 70 and the heat conducting component 40 from being in contact with each other. Therefore, the short-circuit between the heat sink 70 and the heat conducting component 40 can also be restricted.

The sealing body 202 is formed of an insulator. In this case, even if the sealing body 202 and the heat sink 70 come into contact with each other, a short-circuit between the switching element 201 and the heat sink 70 does not occur.

The electronic control unit 1 has a plurality of semiconductor modules 20 (21 to 24). The heat conducting components 40 are provided such that at least a part (41, 42, 43) of the heat conducting components 40 is located between the plurality of semiconductor modules 20. Therefore, the heat of the semiconductor modules 20 is conducted to the heat conducting components 40. As such, it is possible to restrict an excessive increase in temperature of the semiconductor modules 20. Also, since at least a part of the heat conducting components 40 is located between the plurality of semiconductor modules 20, thermal interference between the semiconductor modules 20 can be restricted.

The heat conducting components 40 are provided such that at least a part (41 to 47) of the heat conducting components 40 surrounds the semiconductor modules 20. In this case, heat from the semiconductor modules 20 can be effectively conducted by the heat conducting components 40.

The heat sink 70 has a pillar portion 72 formed so as to extend toward the substrate 10. The heat conducting components 40 are provided such that at least a part of the heat conducting components 40 (a part of 46, a part of 47) is located within the range R2 of the predetermined distance M from the pillar portion 72. In the present embodiment, the predetermined distance M is the same as the diameter of the pillar portion 72. As thus described, at least a part of the heat conducting components 40 is located in the vicinity of the pillar portion 72, so that it is possible to rapidly conduct heat from the semiconductor modules 20 and the heat conducting components 40 to the pillar portion 72. It is thus possible to rapidly release heat from the semiconductor modules 20 and the heat conducting components 40.

The electric power steering device 100 includes the electronic control unit 1, and a motor 101 controlled by the electronic control unit 1 and capable of outputting assist torque for assisting steering by a driver. The electronic control unit 1 of the present embodiment is capable of restricting positional deviation of the heat conducting components 40 from the substrate 10 and falling off the heat conducting components 40 from the substrate 10 even if the heat sink 70 and the substrate 10 come closer to each other due to vibrations, external force or the like. Further, the electronic control unit of the present embodiment is capable of effectively releasing heat from the semiconductor modules 20. Therefore, the electronic control unit 1 of the present embodiment is thus suitable to be used as the electronic control unit of the electric power steering device, a calorific value of which increases by flow of a current having a large value, and which is mounted in a vehicle in which vibrations occur.

Second Embodiment

Figure 6:
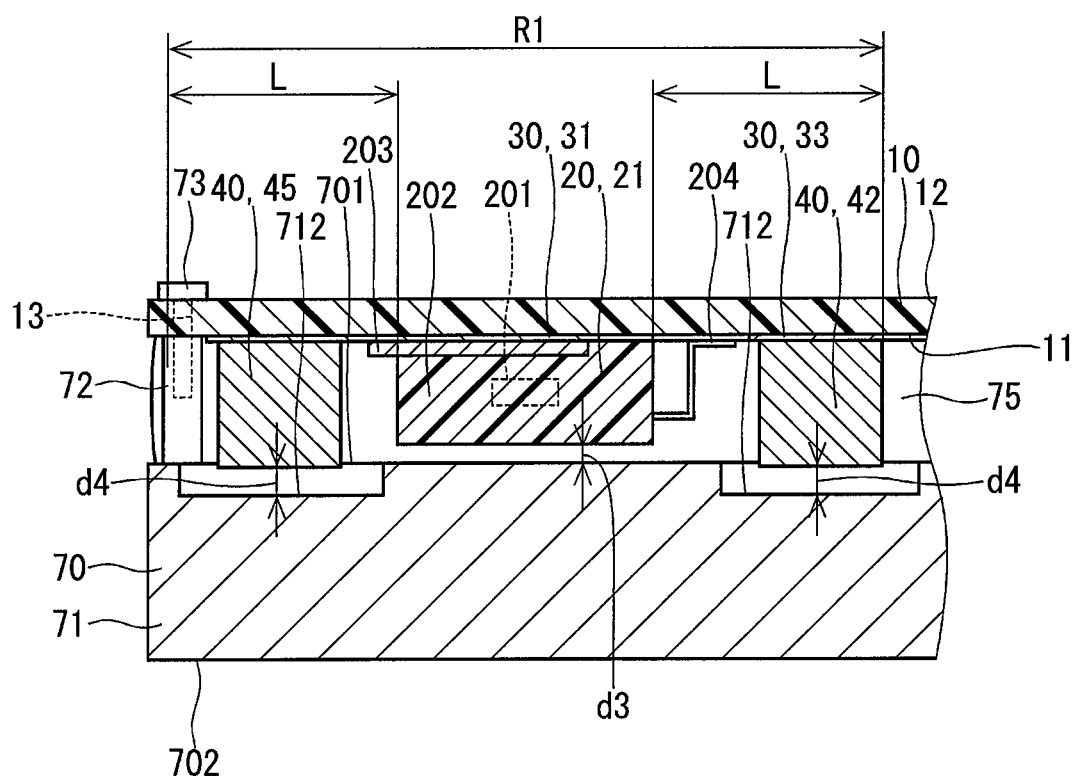
FIG. 6 is a schematic diagram showing a vicinity of heat generating components of an electronic control unit according to a second embodiment of the present disclosure.

FIG. 6 shows a part of the electronic control unit according to a second embodiment of the present disclosure. In the second embodiment, the shapes of the heat conducting component 40 and shape of the heat sink 70 are different from those in the first embodiment.

In the second embodiment, the thickness (height) of the heat conducting component 40 in the thickness direction of the substrate 10 is larger than the thickness of the sealing body 202 of the semiconductor module 202. An end surface of the heat conducting component 40 adjacent to the heat sink 70 is located closer to the other surface 702 of the heat sink 70 than one surface 701 of the heat sink 70.

A body 71 of the heat sink 70 is formed with a special depression (second depression) 712 that depresses toward the other surface 702, that is, depresses in a direction opposite to the substrate 10. The special depression 712 is located at a position corresponding to the heat conducting component 40. The special depression 712 has a rectangular shape to correspond to the shape of the end surface of the heat conducting component 40, the end surface adjacent to the heat sink 70. Note that the special depression 712 is larger than the end surface of the heat conducting component 40, the end surface being adjacent to the heat sink 70. Seven special depressions 712 are correspondingly provided for the heat conducting components 41 to 47.

As shown in FIG. 6, in the present embodiment, a distance d3 between the sealing body 202 of the semiconductor module 20 and the heat sink 70 is equal to or shorter than a distance d4 between the heat conducting component 40 and the one surface 701 of the heat sink 70. In the present embodiment, the distance d3 is set to be shorter than the distance d4. Therefore, even if the heat sink 70 and the substrate come closer to each other due to vibrations, external force or the like, the sealing body 202 and the heat sink 70 come into contact with each other. Therefore, it is possible to surely restrict the heat sink 70 and the heat conducting component 40 from contacting with each other. As such, deviations of the heat conducting component 40 from the substrate 10 and falling off of the heat conducting component 40 from the substrate 10 can be surely restricted.

As described above, in the present embodiment, the heat sink 70 has the special depression 712 that is a depression depressed in the direction opposite to the substrate 10 at the position corresponding to the heat conducting component 40. Therefore, the distance between the outer edge portion of the heat conducting component 40 and the heat sink 70 can be reduced. As such, heat from the heat conducting component 40 and the semiconductor module 20 can be further effectively conducted to the heat sink 70.

Other Embodiments

In the embodiment described above, the example has been shown in which the distance between the heat generating component and the radiator is set to be smaller than the distance between the heat conducting component and the radiator. As another embodiment of the present disclosure, the distance between the heat generating component and the radiator may be set to be equal to or smaller than the distance between the heat conducting component and the radiator. Note that, when the heat conducting component is formed of an electric conductor, the distance between the heat generating component and the radiator is preferably set to be smaller than the distance between the heat conducting component and the radiator.

In the embodiment described above, the example has been shown in which, when the length of the longitudinal side of the sealing body of the heat generating component is defined as the length L, the heat conducting components (41, 44, 45) are provided so as to be located within the range R1 of the predetermined distance L from the outer edge of the sealing body of the heat generating component (21). In contrast, in another embodiment of the present disclosure, the heat conducting components (41, 44, 45) may be provided such that a part of the heat conducting components (41, 44, 45) is located outside the range R1. The heat conducting components (41, 44, 45) may not be provided within the range R1. However, in order to effectively release heat from the heat generating components via the heat conducting components, the heat conducting components are preferably provided in the vicinity of the heat generating components. Further, the sealing body of the heat generating component is not limited to have the rectangular shape, and may be formed in any shape such as a polygonal shape or a circular shape.

In another embodiment of the present disclosure, the heat conducting member may be a heat releasing sheet having a sheet-like shape, using silicon as a base material, and having small heat resistance. In another embodiment of the present disclosure, the heat conducting member may not be provided.

In another embodiment of the present disclosure, the radiator may not have the specific depression nor special depression. Namely, the surface of the radiator facing the heat generating component and the heat conducting component may be a flat surface.

In the embodiment described above, the example has been shown in which the four heat generating components are arranged on the substrate so as to be located at the apexes of the virtual rectangle (see FIG. 2, etc.). In contrast, in another embodiment of the present disclosure, it is also possible to arrange the four heat generating components on the substrate so as to be located at the apexes of, for example, an imaginary square, a parallelogram, a rhombus, a trapezoid, or another quadrangle.

In another embodiment of the present disclosure, the number of the heat generating components is not limited to four, and two, three, or five or more heat generating components may be provided. In this case, the heat generating components may be arranged on the substrate in any manner.

In another embodiment of the present disclosure, the heat conducting component may be formed of any material such as carbon or the like, as long as the material has a heat conductivity equal to or higher than a predetermined value. The heat conducting component is not limited to the electric conductor, but may be provided by an insulator of such as aluminum nitride or silicon nitride. The heat conducting component may not be in contact with the wire on the substrate. The heat conducting component may be in contact with the heat generating component. The shape of the heat conducting component is not limited to the rectangular, and the heat conducting component may have any shape such as polygonal shape, secular shape or the like. The heat conducting component may be plated.

In another embodiment of the present disclosure, the sealing body of the heat generating component is not limited to be formed of resin, and may be formed of an insulator such as aluminum nitride or silicon nitride. The heat generating device may be partially exposed from the sealing body.

In another embodiment of the present disclosure, the radiator is not limited to be formed of aluminum, and may be formed of a material having a heat conductivity equal to or higher than a predetermined value, such as iron, copper, aluminum nitride, or silicon nitride.

The electronic control unit according to the present disclosure may be used not only for the electric power steering device, but may also be used to control the driving of an electric apparatus, such as a motor, of another device.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. An electronic control unit that is configured to control an object to be controlled, the electronic control unit comprising:
a substrate;
a heat generating component that is provided on one surface of the substrate, and generates heat during operation;
a heat conducting component that is formed of a material having a heat conductivity equal to or higher than a predetermined value, and is provided on the one surface of the substrate such that at least a part of the heat conducting component is in a range of a predetermined distance from the heat generating component;
a controller that is provided on the substrate, and is configured to control the operation of the heat generating component to control the object to be controlled; and
a radiator that is provided adjacent to the one surface of the substrate to release heat from the heat generating component and the heat conducting component, wherein
the radiator has a first depression depressed from a surface of the radiator in a direction opposite to the substrate at a position corresponding to the heat generating component,
a distance between the heat generating component and the first depression is equal to or shorter than a distance between the heat conducting component and one surface of the radiator,
the radiator includes a pillar portion extending toward the substrate, and
the heat conducting component is provided such that at least a part of the heat conducting component is located in a range of a predetermined distance from the pillar portion.

2. The electronic control unit according to claim 1, wherein
the heat generating component has a thickness greater than a thickness of the heat conducting component in a thickness direction of the substrate.

3. The electronic control unit according to claim 1, wherein
a surface of the heat generating component opposite to the substrate is located inside of the first depression.

4. The electronic control unit according to claim 1, wherein
the heat generating component and the heat conducting component are provided in one region of the substrate, and
the controller is provided in an other region of the substrate opposite to the one region.

5. The electronic control unit according to claim 1, wherein
the distance between the heat generating component and the first depression is shorter than the distance between the heat conducting component and one surface of the radiator.

6. The electronic control unit according to claim 1, further comprising
a heat conducting member that is provided between the one surface of the substrate and the radiator, and is configured to conduct the heat from the heat generating component and the heat conducting component to the radiator.

7. The electronic control unit according to claim 1, wherein
the heat generating component includes a heat generating element that generates heat during operation and a sealing body that covers at least a part of the heat generating element,
the electronic control unit further comprising a wire on the one surface of the substrate, the wire being electrically connected to the heat generating element, wherein
the heat conducting component is provided by an electric conductor, and is in contact with the wire.

8. The electronic control unit according to claim 7, wherein
the sealing body is provided by an insulator.

9. The electronic control unit according to claim 1, wherein
the heat generating component is one of a plurality of heat generating components, and
the heat conducting component is provided such that at least a part of the heat conducting component is located between the plurality of heat generating components.

10. The electronic control unit according to claim 1, wherein
the heat conducting component is provided such that at least a part of the heat conducting component surrounds the heat generating component.

11. An electric power steering device comprising:
the electronic control unit according to claim 1; and
the object to be controlled that is controlled by the electronic control unit, and outputs assist torque for assisting steering by a driver.

12. An electronic control unit that is configured to control an object to be controlled, the electronic control unit comprising:
a substrate;
a heat generating component that is provided on one surface of the substrate, and generates heat during operation;
a heat conducting component that is formed of a material having a heat conductivity equal to or higher than a predetermined value, and is provided on the one surface of the substrate such that at least a part of the heat conducting component is in a range of a predetermined distance from the heat generating component;

a controller that is provided on the substrate, and is configured to control the operation of the heat generating component to control the object to be controlled; and a radiator that is provided adjacent to the one surface of the substrate to release heat from the heat generating component and the heat conducting component, wherein the radiator has a second depression depressed from a surface of the radiator in a direction opposite to the substrate at a position corresponding to the heat conducting component, and a distance between the heat generating component and the surface of the radiator is equal to or shorter than a distance between the heat conducting component and the second depression, the heat conducting component has a thickness greater than a thickness of the heat generating component in a thickness direction of the substrate.

13. The electronic control unit according to claim 12, wherein a surface of the heat conducting component opposite to the substrate is located inside of the second depression.

14. The electronic control unit according to claim 12, further comprising a heat conducting member that is provided between the one surface of the substrate and the radiator, and is configured to conduct the heat from the heat generating component and the heat conducting component to the radiator.

15. The electronic control unit according to claim 12, wherein the heat generating component includes a heat generating element that generates heat during operation and a sealing body that covers at least a part of the heat generating element, the electronic control unit further comprising a wire on the one surface of the substrate, the wire being electrically connected to the heat generating element, wherein the heat conducting component is provided by an electric conductor, and is in contact with the wire.

16. An electric power steering device comprising:

the electronic control unit according to claim 12; and the object to be controlled that is controlled by the electronic control unit, and outputs assist torque for assisting steering by a driver.

* * * * *